United States Patent
Moon

(10) Patent No.: US 9,772,514 B2
(45) Date of Patent: Sep. 26, 2017

(54) DRIVING INTEGRATED CIRCUIT, DISPLAY DEVICE INCLUDING THE SAME, AND METHOD OF MEASURING BONDING RESISTANCE

(71) Applicant: Samsung Display Co., Ltd., Yongin, Gyeonggi-do (KR)

(72) Inventor: Jong-Won Moon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 317 days.

(21) Appl. No.: 14/452,487

(22) Filed: Aug. 5, 2014

(65) Prior Publication Data

US 2015/0198641 A1    Jul. 16, 2015

(30) Foreign Application Priority Data

Jan. 14, 2014  (KR) .................. 10-2014-0004707

(51) Int. Cl.
| | |
|---|---|
| *G01R 31/02* | (2006.01) |
| *G02F 1/01* | (2006.01) |
| *G01R 31/04* | (2006.01) |
| *G09G 3/00* | (2006.01) |
| *G02F 1/1345* | (2006.01) |
| *G01R 31/28* | (2006.01) |

(52) U.S. Cl.
CPC ......... *G02F 1/0121* (2013.01); *G01R 31/046* (2013.01); *G02F 1/13452* (2013.01); *G09G 3/00* (2013.01); *G09G 3/006* (2013.01); *G01R 31/2884* (2013.01)

(58) Field of Classification Search
CPC . G02F 1/0121; G02F 1/13452; G01R 31/046; G01R 31/048; G01R 31/2884; G01R 27/00; G01R 27/02; G09G 3/00; G09G 3/006; G09G 3/36; G09G 2330/12

USPC ................ 324/537, 686, 691, 693, 750.3

See application file for complete search history.

(56) References Cited

U.S. PATENT DOCUMENTS

| | | | |
|---|---|---|---|
| 2003/0023394 A1* | 1/2003 | Bierl | G01R 27/02 702/57 |
| 2007/0210835 A1* | 9/2007 | Aghtar | G11C 27/026 327/94 |
| 2012/0105085 A1 | 5/2012 | Chen et al. | |
| 2012/0161660 A1 | 6/2012 | Joo | |
| 2014/0062936 A1* | 3/2014 | Al-Dahle | G09G 3/36 345/174 |

FOREIGN PATENT DOCUMENTS

| | | |
|---|---|---|
| JP | 2001-050996 A | 2/2001 |
| KR | 10-2012-0071971 A | 7/2012 |

* cited by examiner

*Primary Examiner* — Jeff Natalini
*Assistant Examiner* — Steven Yeninas
(74) *Attorney, Agent, or Firm* — Lewis Roca Rothgerber Christie LLP

(57) ABSTRACT

A driving integrated circuit bonded to a mounting area of a display panel, the circuit including a plurality of connection contact pads electrically coupled to a plurality of signal pads in the mounting area, at least one test contact pad electrically coupled to at least one test pad in the mounting area, and a resistance measuring unit configured to charge an external capacitor electrically coupled to a bonding part of the test pad and the test contact pad and to measure a bonding resistance of the bonding part based on a magnitude or a discharging time of a charging voltage of the external capacitor.

10 Claims, 7 Drawing Sheets

DRIVING INTEGRATED CIRCUIT, DISPLAY DEVICE INCLUDING THE SAME, AND METHOD OF MEASURING BONDING RESISTANCE

CROSS-REFERENCE TO RELATED APPLICATION

This application claims priority to and the benefit of Korean Patent Application No. 10-2014-0004707, filed on Jan. 14, 2014, in the Korean Intellectual Property Office, the disclosure of which is incorporated herein in its entirety by reference.

BACKGROUND

1. Field

One or more embodiments of the present invention relate to a driving integrated circuit, a display device including the same, and a method of measuring a bonding resistance by using the driving integrated circuit.

2. Description of the Related Art

A flat type display device includes a display panel and a driving device. The display panel includes a display unit and a non-display unit. The display unit includes a plurality of pixels located at regions where a plurality of gate lines and a plurality of lines cross each other. The non-display unit, that is, the periphery of the display unit, includes a data pad and a gate pad, which are respectively formed at the end parts of the gate line and the data line to interface with an external driving device through an electrical signal.

The driving device includes a chip or a film for driving the display panel, for example, a driving integrated circuit (DIC) and a flexible printed circuit (FPC) film.

As a method of mounting a driving integrated circuit on a display panel, there are a chip on glass (COG) method and a film on glass (FOG) method. In the case of the COG method and the FOG method, a bonding resistance (or a COG/FOG resistance) due to the coupling of a display panel, a driving integrated circuit, and a flexible printed circuit film exists. As the COG/FOG resistance increases, poor performance of a display device is caused. Therefore, an accurate measurement of the COG/FOG resistance is very important during a process.

SUMMARY

Aspects of embodiments of the present invention are directed to a driving integrated circuit having an increased number of terminals for driving a display device and/or test points for measuring a coupling resistance in a limited bonding area, and a display device including the same.

Additional aspects will be set forth in part in the description which follows and, in part, will be apparent from the description, or may be learned by practice of the presented embodiments.

According to one or more embodiments of the present invention, there is provided a driving integrated circuit bonded to a mounting area of a display panel, the circuit including: a plurality of connection contact pads electrically coupled to a plurality of signal pads in the mounting area; at least one test contact pad electrically coupled to at least one test pad in the mounting area; and a resistance measuring unit configured to charge an external capacitor electrically coupled to a bonding part of the test pad and the test contact pad and to measure a bonding resistance of the bonding part based on a magnitude or a discharging time of a charging voltage of the external capacitor.

The resistance measuring unit may include: an amplifier selectively coupled to the external capacitor by a first switch and configured to output an output voltage to charge the external capacitor; and a comparator selectively coupled to the external capacitor by a second switch and configured to compare the charging voltage of the external capacitor with a varying reference voltage.

The resistance measuring unit may further include: a register configured to store an output of the comparator; and a reference voltage generating unit configured to increase or decrease the reference voltage and to output the reference voltage until the output of the comparator changes from a first voltage level to a second voltage level.

The resistance measuring unit may include: an amplifier selectively coupled to the external capacitor by a first switch and configured to output an output voltage to charge the external capacitor; a comparator including a first input terminal and a second input terminal, selectively coupled to the external capacitor by a second switch, and configured to compare a voltage of the first input terminal with a reference voltage applied to the second input terminal, while the charging voltage of the external capacitor is discharged by the bonding resistance and a discharging resistance coupled to the first input terminal; and a counter configured to measure a time at which the voltage of the first input terminal reaches the reference voltage.

The resistance measuring unit may further include a register configured to store an output of the counter.

The external capacitor may be in a non-display area of the display panel.

The external capacitor may be at a flexible printed circuit film mounted at the display panel.

The signal pad may be at one end of each of a gate line and a data line at the display panel.

According to one or more embodiments of the present invention, there is provided a display device including: a display panel including a plurality of signal pads and at least one test pad; a plurality of connection contact pads electrically coupled to the plurality of signal pads, and at least one test contact pad electrically coupled to the at least one test pad, in a mounting area of the display panel; and a resistance measuring unit configured to charge an external capacitor electrically coupled to a bonding part of the test pad and the test contact pad, and to measure a bonding resistance of the bonding part based on a magnitude or discharging time of a charging voltage of the external capacitor.

The resistance measuring unit may include: an amplifier selectively coupled to the external capacitor by a first switch and configured to output an output voltage to charge the external capacitor; and a comparator selectively coupled to the external capacitor by a second switch and configured to compare the charging voltage of the external capacitor with a varying reference voltage.

The resistance measuring unit further may include: a register configured to store an output of the comparator; and a reference voltage generating unit configured to increase or decrease the reference voltage and to output the reference voltage until the output of the comparator changes from a first voltage level to a second voltage level.

The resistance measuring unit may include: an amplifier selectively coupled to the external capacitor by a first switch and configured to output an output voltage to charge the external capacitor; a comparator including a first input terminal and a second input terminal, selectively coupled to the external capacitor by a second switch, and configured to compare a voltage of the first input terminal with a reference voltage applied to the second input terminal, while the charging voltage of the external capacitor is discharged by the bonding resistance and a discharging resistance coupled to the first input terminal; and a counter configured to measure a time at which the voltage of the first input terminal reaches the reference voltage.

The resistance measuring unit may further include a register configured to store an output of the counter.

The external capacitor may be at a non-display area of the display panel.

The external capacitor may be at a flexible printed circuit film mounted on the display panel.

The signal pad may be at one end of each of a gate line and a data line at the display panel.

According to one or more embodiments of the present invention, there is provided a method of measuring a bonding resistance of a display device resulting from bonding a display panel and a driving integrated circuit, the method including: charging, by the driving integrated circuit, an external capacitor outside of the driving integrated circuit and electrically coupled to a bonding part, where a test pad in a mounting area of the display panel and a test contact pad of the driving integrated circuit are electrically coupled; measuring, by the driving integrated circuit, a magnitude or discharging time of a charging voltage of the external capacitor; and measuring, by an external controller, a bonding resistance of the bonding part based on the magnitude or discharging time of the charging voltage.

The measuring of the magnitude of the charging voltage may include: comparing a charging voltage of the external capacitor with a reference voltage; and varying the reference voltage until the reference voltage is equal to the charging voltage.

The measuring of the discharging time may include: while the charging voltage of the external capacitor is discharged by the bonding resistance and a discharging resistance coupled in series to the bonding resistance, comparing a node voltage between the bonding resistance and the discharging resistance with a reference voltage; and measuring a time at which the node voltage reaches the reference voltage.

The external capacitor is in a non-display area of the display panel or on a flexible printed circuit film mounted on the display panel.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
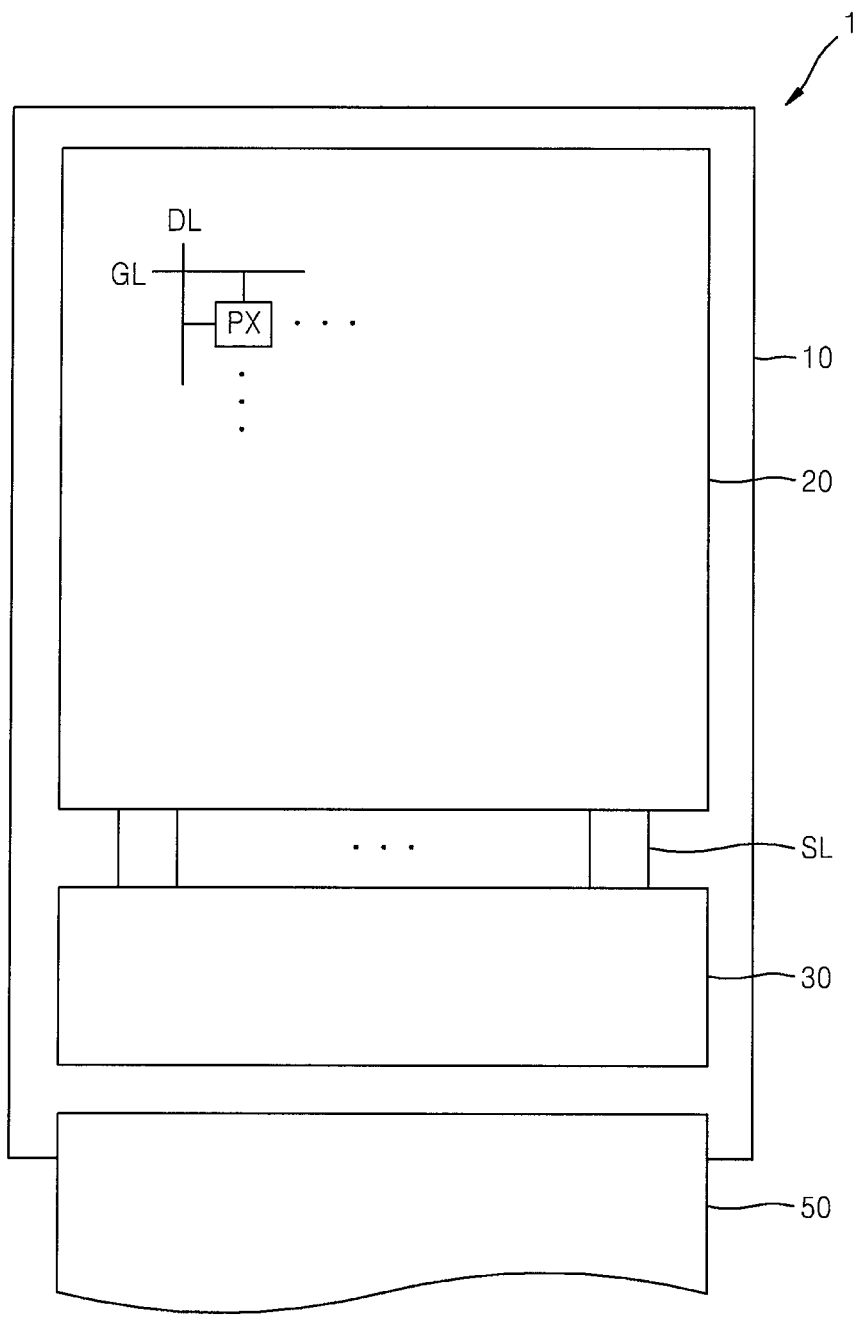
FIG. 1 is a view illustrating a display device, according to an example embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present invention may apply various modifications and thus have diverse embodiments. Therefore, specific embodiments are shown in the drawings and described in more detail. The effects and features of the present invention and methods of achieving them will be clarified through following embodiments described with reference to the accompanying drawings. However, the present invention is not limited to the embodiments below and implemented in various forms.

Hereinafter, the embodiments of the present invention are described in more detail with reference to the accompanying drawings and while described referring to the drawings, like reference numerals refer to like elements and their descriptions are not repeated.

In the embodiments below, the terms 'first' and 'second' are not construed as being limited to restrictive meanings and used for distinguishing one component from another component. The terms of a singular form may include plural forms unless they have a clearly different meaning in the contest.

In the embodiments below, the term "include" or "comprise" means that there is a feature or a component listed in the specification and at least one another feature or component is not excluded.

FIG. 1 is a view illustrating a display device, according to an example embodiment of the present invention.

The display device 1 may include various kinds of display devices, for example, an organic light emitting display device, a liquid crystal display device, and a field emission display (FED) device. The display device 1 includes a display panel and a driving device. The driving device includes a chip or a film for driving the display panel, for example, a driving integrated circuit and an FPC film.

Referring to FIG. 1, the display device 1 includes a display panel 10, a driving integrated circuit 30 applying a drive signal to each of the gate lines GL and the data lines DL formed at the display panel 10, and a flexible printed circuit (FPC) 50 transmitting data and control signals (e.g., predetermined data and control signals) to the driving integrated circuit 30.

A plurality of gate lines GL spaced (e.g., spaced at predetermined distances) from one another in a first direction, a plurality of data lines DL spaced (e.g., spaced at predetermined distances) from one another in a second direction and crossing (e.g., intersecting) the gate lines GL, and a display unit 20 including a plurality of pixels PX, each coupled to a gate line GL and a data line DL, are formed at the display panel 10.

The pixel PX may be a red pixel emitting red light, a green pixel emitting green light, or a blue pixel emitting blue light. However, according to an embodiment of the present invention, the pixel PX is not limited to a pixel emitting red, blue, or green and may be a pixel emitting white or another color light other than those. The pixel PX may include a pixel circuit and a light emitting device electrically coupled to (e.g., connected to) the pixel circuit and emitting light. The pixel circuit may include at least one thin film transistor and at least one capacitor.

A gate pad for delivering a scan signal applied from the driving integrated circuit 30 to a gate line GL is formed at one end of the gate line GL. A data pad for delivering a data signal applied from the driving integrated circuit 30 to a data line DL is formed at one end of the data line DL.

The driving integrated circuit 30 may be electrically bonded to the gate pad and the data pad by using an anisotropic conductive film (ACF) through a chip on glass (COG) method. The driving integrated circuit 30 generates scan signals and data signals in correspondence to driving power and signals delivered from the outside and supplies them to the gate lines GL and the data lines DL, respectively. For this, the driving integrated circuit 30 may include at least one scan driving unit (e.g., scan driver) for generating the scan signals and at least one data driving unit for generating the data signals. The driving integrated circuit 30 may include contact pads (for example, a bump, a conductive ball, or a conductive pin) coupled to the gate pads and the data pads.

A connection pad for connecting the driving integrated circuit 30 and the FPC 50 may be formed at the display panel 10. The FPC 50 may include a contact pad (for example, a bump, a conductive ball, or a conductive pin). The FPC 50 may be bonded to a connection pad by using an anisotropic conductive film (ACE) through a chip on glass (COG) method and may be electrically coupled to (e.g., electrically connected to the driving integrated circuit 30.

The FPC 50 receives drive signals from an external driving circuit. The FPC 50 receiving drive signals generates various control signals and drives the pixel PX and/or the driving integrated circuit 30 in correspondence thereto.

The driving integrated circuit 30 includes a resistance measuring unit for charging an external capacitor electrically coupled to (e.g., electrically connected to) a bonding part and measuring a bonding resistance of the bonding part on the basis of the magnitude of a charging voltage or a discharging time of a charging voltage of the external capacitor. The resistance measuring unit is described later.

In the embodiment of FIG. 1, the driving integrated circuit 30 and the FPC 50 are provided separately. However, the driving integrated circuit 30 may be formed at the FPC 50 and the FPC 50 may be mounted on the display panel 10.

Figure 2:
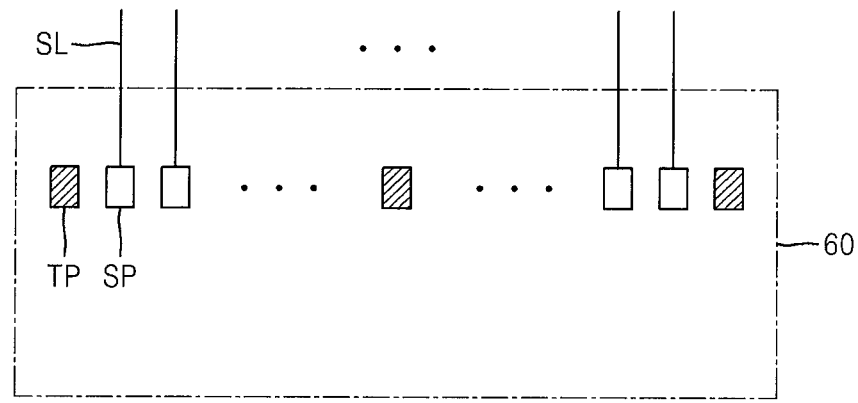
FIG. 2 is a plan view illustrating an enlarged mounting area where a signal pad of a display device is formed, according to an example embodiment of the present invention.
Figure 3:
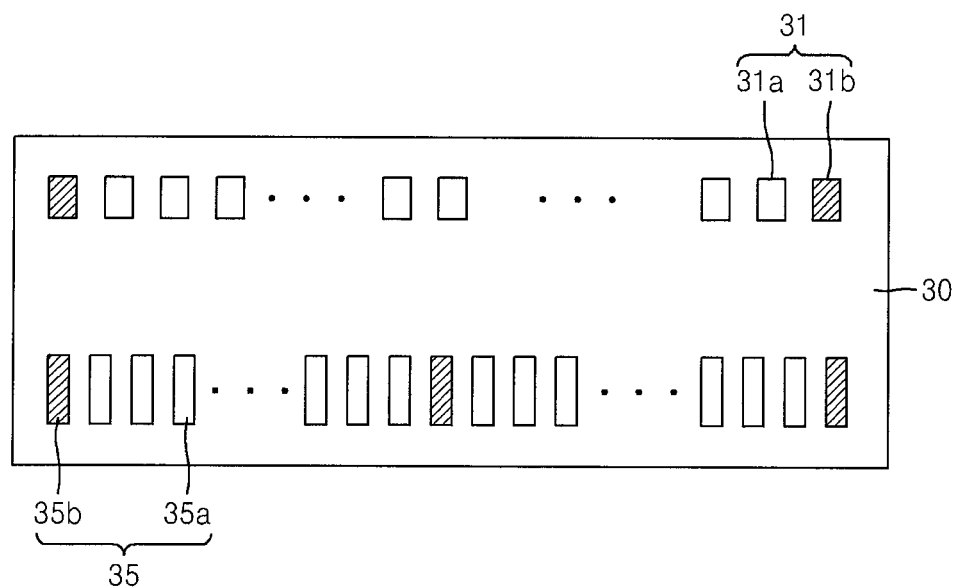
FIG. 3 is a plan view illustrating an enlarged bottom surface of a driving integrated circuit, according to an example embodiment of the present invention.

FIG. 2 is a plan view illustrating an enlarged mounting area where a signal pad of a display device is formed, according to an example embodiment of the present invention. FIG. 3 is a plan view illustrating an enlarged bottom surface of a driving integrated circuit, according to an example embodiment of the present invention.

Referring to FIG. 2, signal pads SP respectively coupled to signal lines SL are spaced from each other in an IC mounting area 60 of the display panel 10. The signal line SL includes a gate line GL and a data line DL. The signal pad SP includes a gate pad and a data pad.

In addition to the signal pad SP, a test pad TP is formed at a test point for measuring a bonding resistance in the IC mounting area 60. In the embodiment of FIG. 2, although three test points TPs are respectively located at the center, left and right, the present invention is not limited thereto, and thus at least one test pad may be formed (e.g., formed at a predetermined position) by setting a plurality of test points TPs.

The signal pad SP is electrically coupled to the signal line SL and delivers a driving signal of the driving integrated circuit 30 to the signal line SL. However, since the test pad TP is not utilized to drive the display device 1, it is not coupled to the gate line GL or the data line DL. As another embodiment, a dummy gate line GL or a dummy data line DL may be formed at the display panel 10 and the test pad TP may be coupled to the dummy gate line GL or the dummy data line DL. As another embodiment, the test pad TP is coupled to the signal line SL of the display panel 10 and a switch may be positioned at the signal line SL coupled to the test pad TP.

The test pad TP may be formed during the same process as the signal pad SP. The signal pad SP and the test pad TP are formed of a conductive material, and for example, may be formed as a transparent electrode such as an indium thin oxide (ITO) electrode.

Referring to FIG. 3, the driving integrated circuit may include a plurality of input pads 31 and output pads 35 as contact pads.

The input pad 31 is an input and output pad. The input pad 31 includes a first input pad 31a and a second input pad 31b. The first input pad 31a and the second input pad 31b may be electrically coupled to the FPC 50. The first input pad 31a is a connection contact pad for receiving a signal from the FPC 50 and the second input pad 31b may be a test contact pad for measuring a bonding resistance.

The output pad 35 includes a first output pad 35a and a second output pad 35b. The first output pad 35a may be a connection contact pad that is one-to-one coupled to the signal pad SP and outputs a scan signal and a data signal, generated by the driving integrated circuit 30, to the gate line GL and the data line DL through the signal pad SP. The second output pad 35b may be a test contact pad for measuring a bonding resistance coupled to the test pad TP. FIG. 3 is a view illustrating the second output pads 35b at the center and the left and right corresponding to the test pads TP of FIG. 2.

The driving integrated circuit 30 is mounted on the IC mounting area 60 of the display panel 10 through bonding. A drive signal outputted from the driving integrated circuit 30 is applied to the pixels PXs of the display unit 20 through the signal lines SLs respectively coupled to the signal pads SPs.

Figure 4:
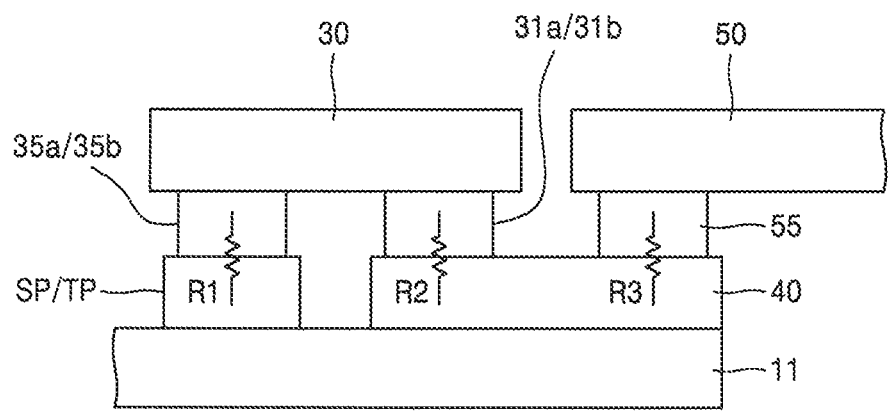
FIG. 4 is a partial sectional view of a display device where a driving integrated circuit and an flexible printed circuit (FPC) are mounted, according to an example embodiment of the present invention.

FIG. 4 is a partial sectional view of a display device where a driving integrated circuit and an FPC are mounted, according to an example embodiment of the present invention.

Referring to FIG. 4, the driving integrated circuit 30 is mounted at an IC mounting area on a bottom substrate 11 of the display panel 10 and the signal pad SP or the test pad TP is one-to-one bonded to the first output pad 35a or the second output pad 35b of the driving integrated circuit 30 by using an ACF through a COG method. Then, the first input pad 31a or the second input pad 31b of the driving integrated circuit 30 is bonded to the connection pad 40 by using an ACF through a COG method.

The contact pad 55 of the FPC 50 is coupled to the connection pad 40 by using an ACF through an FOG method. The contact pad 55 of the FPC 50 may include a connection contact pad for signal transmission and a test contact pad for measuring a bonding resistance. The connection pad 40 may be formed during the same process as the signal pad SP and the test pad TP. The connection pad 40 may be formed of a conductive electrode.

There may be a bonding resistance R1 by bonding a connection contact pad (for example, the first output pad 35a) of the driving integrated circuit 30 and the signal pad SP of the display panel 10. Additionally, there may be a bonding resistance R2 by bonding the first input pad 31a of the driving integrated circuit 30 and the connection pad 40 of the display panel 10. Further, there may be a bonding resistance R3 by bonding the connection pad 40 and the connection contact pad 55 of the FPC 50. The bonding resistances R1, R2, and R3 may include a resistance of a pad itself.

According to an embodiment of the present invention, at a test point for measuring a bonding resistance, the bonding resistances R1, R2, and R3 may be measured by using the bonding part between the second output pad 35b of the driving integrated circuit 30 and the test pad TP of the display panel 10, the bonding part between the second input pad 31b of the driving integrated circuit 30 and the connection pad 40 of the display panel 10, and the bonding part between the connection pad 40 of the display panel 10 and the test contact pad 55 of the FPC 40, respectively.

The driving integrated circuit 30 and the FPC 50, bonded to the display panel 10, may be used in tandem with a plurality of signal and power terminals (or pads). However, since a mounting area is limited, it may be difficult (e.g., it is a burden) to add terminals for measuring a bonding resistance in addition to terminals for driving a display device. Even when added, it is difficult to add the desired number of terminals at a desired position. A decrease in the number of test points due to such an area limitation may act as an obstacle to accurately test the quality of a display device.

Conventionally, two bonding parts (or, measurement terminals) and a structure connecting them are utilized to measure a bonding resistance of a display device. However, according to an embodiment of the present invention, by reducing the number of bonding parts for measuring a bonding resistance in half, as many test points as possible may be implemented at the driving integrated circuit 30 and the FPC 50 having a limited mounting area.

Hereinafter, a configuration of the driving integrated circuit 30 for measuring a COG bonding resistance due to COG mounting and/or an FOG bonding resistance due to FOG mounting and a method of the driving integrated circuit 30 to measure a bonding resistance are described.

Figure 5:
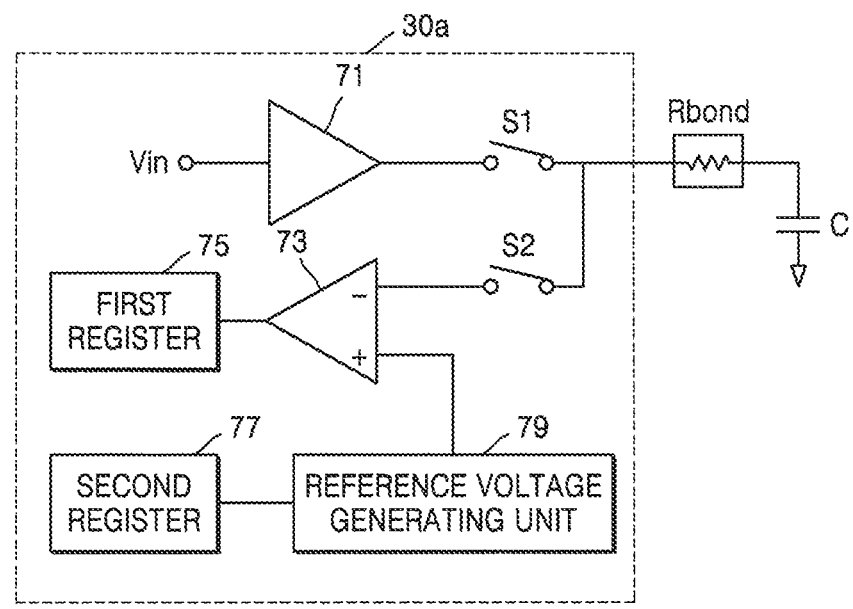
FIG. 5 is a view illustrating a bonding resistance measurement system, according to an example embodiment of the present invention.
Figure 6A:
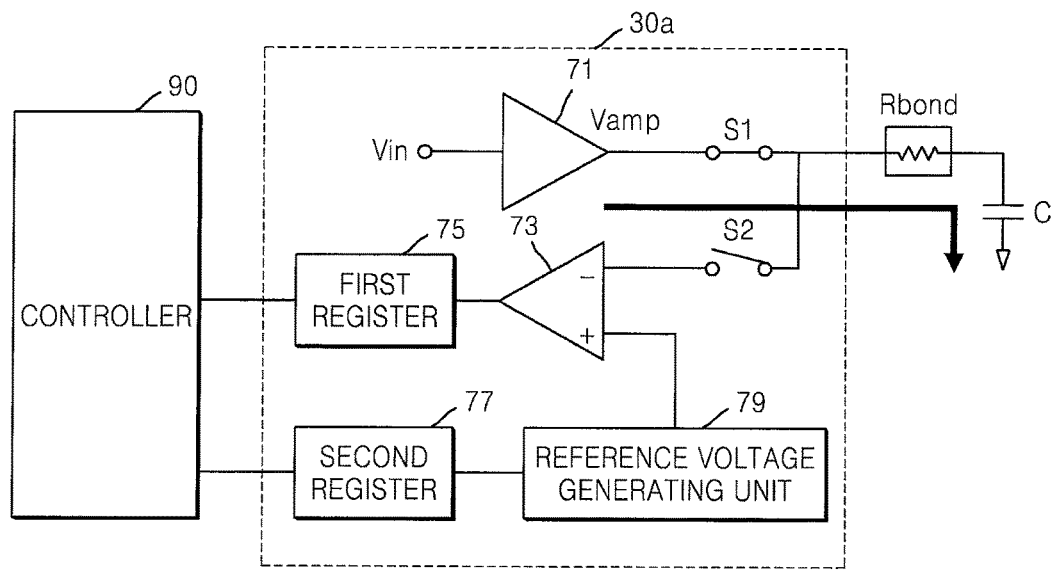
FIGS. 6A and 6B are views illustrating a method of measuring a bonding resistance by using the bonding resistance measurement system of FIG. 5, according to an example embodiment of the present invention.
Figure 6B:
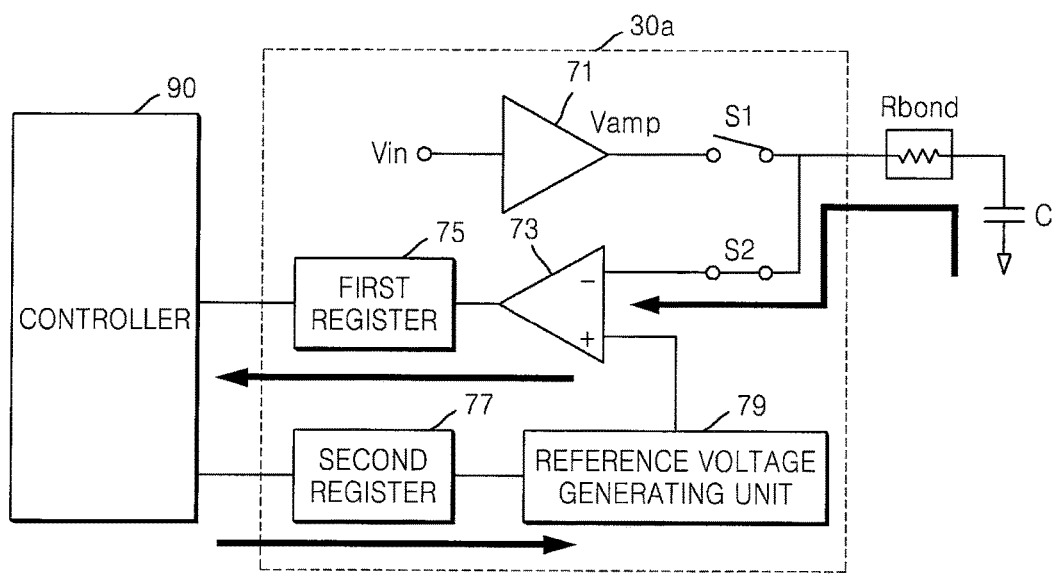

FIG. 5 is a view illustrating a bonding resistance measurement system, according to an example embodiment of the present invention. FIGS. 6A and 6B are views illustrating a method of measuring a bonding resistance by using the bonding resistance measurement system of FIG. 5, according to an example embodiment of the present invention.

Referring to FIG. 5, one bonding part is utilized to measure a bonding resistance. The bonding resistance measurement system includes a resistance measuring unit 30a located inside the driving integrated circuit 30 and a capacitor C located outside the driving integrated circuit 30.

A bonding resistance $R_{bond}$ may be a bonding resistance R1 of the bonding between the second output pad 35b of the driving integrated circuit 30 and the test pad TP of the display panel 10, or the sum (R2+R3) of a bonding resistance R2 of the bonding between the second input pad 31b of the driving integrated circuit 30 and the connection pad 40 for test, and a bonding resistance R3 of the bonding between the test contact pad 55 of the FPC 50 and the connection pad 40 for test.

The capacitor C may be electrically coupled between (e.g., electrically connected between) a bonding part between pads and a ground power and may be formed at the periphery or non-display area of the display panel 10 or the FPC 50.

The resistance measuring unit 30a includes a first switch S1, a second switch S2, an amplifier 71, a comparator 73, a first register 75, a second register 77, and a reference voltage generating unit 79.

The amplifier 71 is coupled to an external capacitor C through the first switch S1. The amplifier 71 receives a power voltage $V_{in}$ and outputs an amplified voltage. The power voltage $V_{in}$ may be an internal voltage of the driving integrated circuit 30.

The negative (−) terminal of the comparator 73 is coupled to the second switch S2 and its positive (+) terminal is coupled to the reference voltage generating unit 79. The output terminal of the comparator 73 is coupled to the first register 75. The comparator 73 compares a voltage of the capacitor, inputted to the negative terminal, and a reference voltage. If the capacitor voltage is higher than the reference voltage, the comparator outputs a high level of voltage and if the capacitor voltage is lower than the reference voltage, outputs a low level of voltage.

The first register 75 is coupled to the comparator 73. The first register 75 stores a high or low level of digital voltage value outputted from the comparator 73.

The second register 77 is coupled to the reference voltage generating unit 79. The second register 77 stores a digital voltage value corresponding to the reference voltage changing according to an external control signal.

The reference voltage generating unit 79 generates a reference voltage corresponding to the digital value of the second register 77 and outputs the generated reference voltage to the positive (+) terminal of the comparator 73.

The first switch S1 couples the amplifier 71 with the capacitor C and the second switch S2 couples the comparator 73 with the capacitor C.

Referring to FIG. 6A, first, the first switch S1 is coupled and the capacitor C is charged with an output voltage Vamp of the amplifier 71 during a time t (e.g., predetermined time t).

At this point, a voltage $V_{cap}$ of the capacitor C is determined by the bonding resistance $R_{bond}$, the capacity $C_{ext}$ of the capacitor C, the output voltage Vamp of the amplifier 71, and the charging time t as the following equation 1.

$$V_{cap} = V_{amp} * (1 - e^{(-t/(R_{bond} * C_{ext}))}) \quad (1)$$

Referring to FIG. 6B, after the time t (e.g., predetermined time t), the first switch S1 is opened and the second switch S2 is coupled. Accordingly, the charging voltage $V_{cap}$ of the capacitor C is applied to the negative terminal of the comparator 73. The comparator 73 compares the charging voltage $V_{cap}$ of the capacitor C and the reference voltage $V_{ref}$. If the capacitor charging voltage $V_{cap}$ is higher than the reference voltage $V_{ref}$, the comparator outputs a high level of voltage and if the capacitor charging voltage $V_{cap}$ is lower than the reference voltage $V_{ref}$, outputs a low level of voltage. The first register 75 stores a high or low level of digital voltage value outputted from the comparator 73.

An external controller 90 reads a digital voltage value of the first register 75 through a driving integrated circuit interface. The driving integrated circuit interface may be a CPU interface, a serial interface, an MIPI, or the like.

The external controller 90 changes the value of the second register 77 if an output of the comparator 73 is a high level. The reference voltage generating unit 79 changes and outputs the reference voltage $V_{ref}$ according to a changed value of the second register 77. The external controller 90 changes the value of the second register 77 to raise the reference voltage $V_{ref}$ until the output of the comparator 73 becomes a low level. The external controller 90 changes the value of the second register 77 to lower the reference voltage $V_{ref}$ until the output of the comparator 73 becomes a high level. For example, the reference voltage $V_{ref}$ is outputted variably until it equals to the capacitor charging voltage $V_{cap}$ and when the output of the comparator 73 changes, the capacitor charging voltage $V_{cap}$ may be checked.

When the capacitor charging voltage $V_{cap}$ is checked, the bonding resistance may be calculated by using the output voltage Vamp of the amplifier 71, the capacity $C_{ext}$ of the capacitor C, and the charging time t of the capacitor C as the following equation 2.

$$R_{bond} = -\frac{t}{\ln\left(\frac{V_{amp} - V_{cap}}{V_{amp}}\right) * C_{ext}} \quad (2)$$

Figure 7:
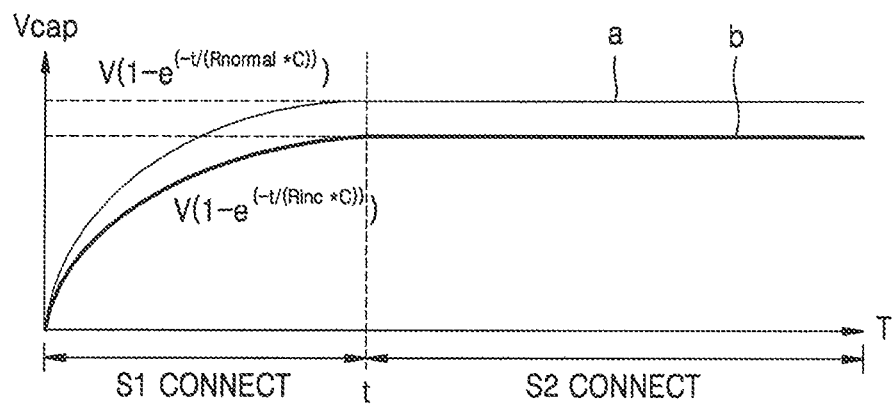
FIG. 7 is a graph illustrating the change in a capacitor voltage as a function of time for a measured bonding resistance, according to an embodiment of the present invention shown in FIG. 5.

FIG. 7 is a graph illustrating the change in a capacitor voltage $V_{cap}$ as a function of time T for a measured bonding resistance $R_{bond}$, according to an example embodiment of the present invention. Referring to FIG. 7, it is observed that the capacitor voltage $V_{cap}$ charged during the same charging time t is higher when the bonding resistance $R_{bond}$ is low (curve a) compared to when the bonding resistance $R_{bond}$ is high (curve b). That is, based on the charging degree of the capacitor voltage $V_{cap}$ during a time (e.g., predetermined time), it may be determined whether or not the bonding resistance $R_{bond}$ is increased beyond a normal value and the increased amount of the bonding resistance may be confirmed.

Figure 8:
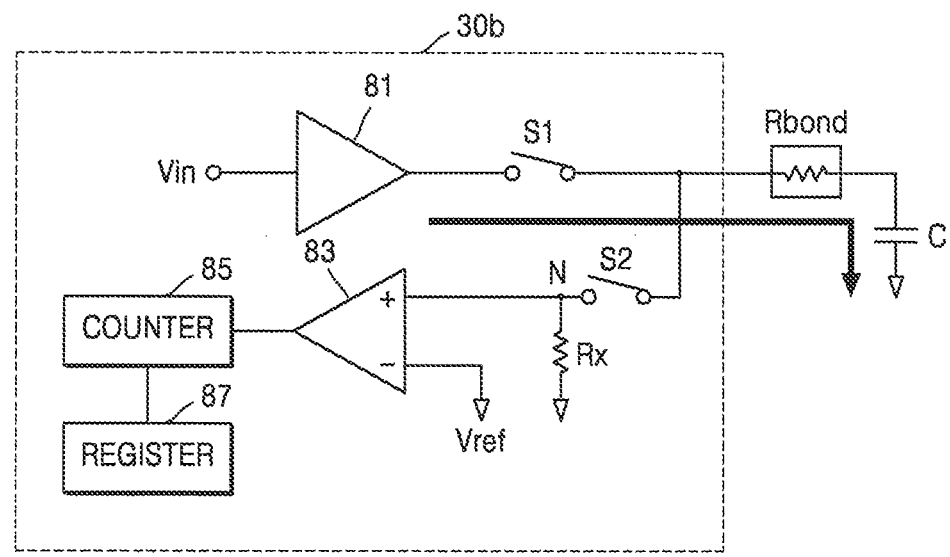
FIG. 8 is a view illustrating a bonding resistance measurement system, according to another example embodiment of the present invention.
Figure 9A:
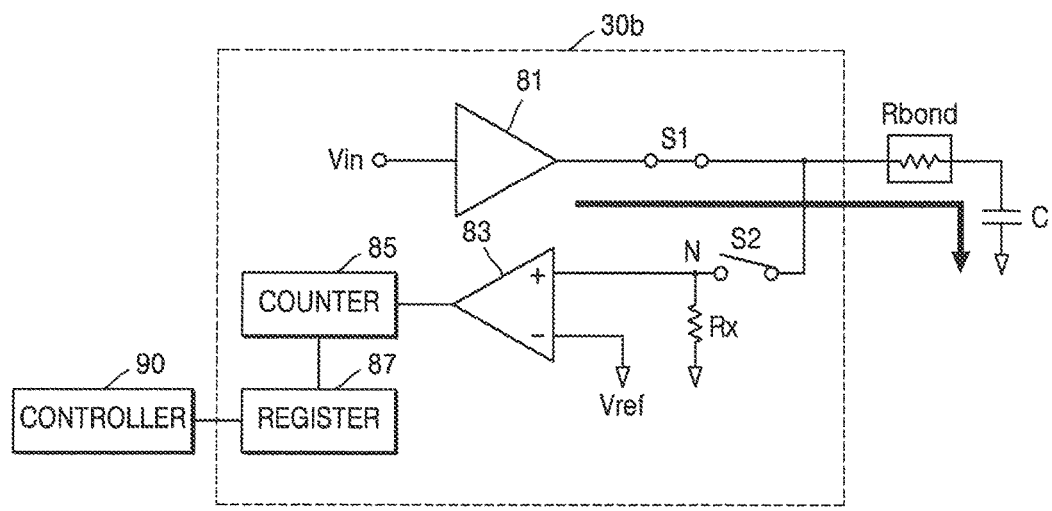
FIGS. 9A and 9B are views illustrating a method of measuring a bonding resistance by using the bonding resistance measurement system of FIG. 8, according to an example embodiment of the present invention.
Figure 9B:
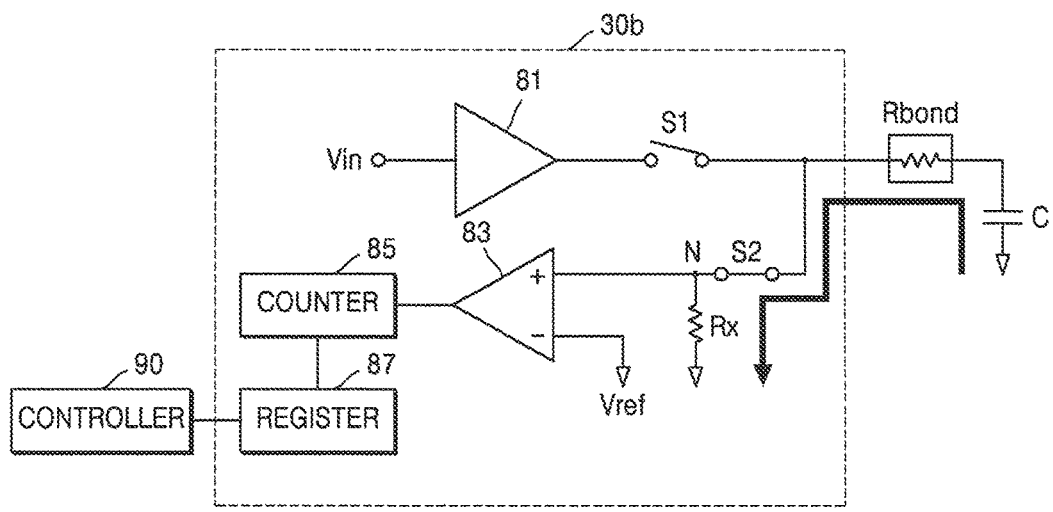

FIG. 8 is a view illustrating a bonding resistance measurement system, according to another example embodiment of the present invention. FIGS. 9A and 9B are views illustrating a method of measuring a bonding resistance by using the bonding resistance measurement system of FIG. 8, according to an example embodiment of the present invention.

Referring to FIG. 8, one bonding part is utilized to measure a bonding resistance. The bonding resistance measurement system includes a resistance measuring unit 30b located inside the driving integrated circuit 30 and a capacitor C located outside the driving integrated circuit 30.

A bonding resistance $R_{bond}$ may be a bonding resistance R1 of the bonding between the second output pad 35b of the driving integrated circuit 30 and the test pad TP of the display panel 10, or the sum (R2+R3) of a bonding resistance R2 of the bonding between the second input pad 31b of the driving integrated circuit 30 and the connection pad 40 for test, and a bonding resistance R3 of the bonding between the test contact pad 55 of the FPC 50 and the connection pad 40 for test.

The capacitor C may be electrically coupled between a bonding part between pads and a ground power and may be formed at the periphery or non-display area of the display panel 10 or the FPC 50.

The resistance measuring unit 30b includes a first switch S1, a second switch S2, an amplifier 81, a comparator 83, a counter 85, and a register 87.

The amplifier 81 is coupled to an external capacitor C through the first switch S1. The amplifier 81 receives a power voltage $V_{in}$ and outputs an amplified voltage. The power voltage $V_{in}$ may be an internal voltage of the driving integrated circuit 30.

The positive (+) terminal of the comparator 83 is coupled to the second switch S2 and its negative (−) terminal receives the reference voltage Vref. A discharge resistance Rx is coupled in serial (e.g., in series) to the bonding resistance Rbond and may be coupled between the positive terminal of the comparator 83 and a ground terminal. The output terminal of the comparator 83 is coupled to the counter 85. The comparator 83 compares a voltage of a node N, inputted to the positive terminal, and the reference voltage Vref. If the voltage of the node N is lower than the reference voltage Vref, the comparator 73 outputs a low level of voltage.

The counter 85 is coupled to the comparator 83. The counter 85 is activated by a start signal and counts a time until the comparator 83 outputs a low level by using a clock signal CLOCK, that is, until a voltage (for example, the voltage of the node N) discharged by the bonding resistance $R_{bond}$ reaches the reference voltage $V_{ref}$, and converts a count value into a digital value.

The register 87 is coupled to the counter 85. The register 87 stores a value outputted from the counter 85.

The first switch S1 couples the amplifier 81 with the capacitor C and the second switch S2 couples the comparator 83 with the capacitor C.

Referring to FIG. 9A, first, the first switch S1 is coupled and the capacitor C is charged with an output voltage $V_{amp}$ of the amplifier 81 during a time t (e.g., predetermined charging time t).

Referring to FIG. 9B, after the charging time t, the first switch S1 is opened and the second switch S2 is closed (e.g., connected). Accordingly, the charging voltage $V_{cap}$ of the capacitor C is discharged through the bonding resistance $R_{bond}$ and the discharging resistance Rx. Concurrently (e.g., simultaneously), the comparator 83 compares a voltage of a node N and the reference voltage $V_{ref}$ which are inputted to the positive terminal of the comparator 83. The voltage of the node N is a voltage dropped from the charging voltage $V_{cap}$ of the capacitor C by the bonding resistance $R_{bond}$. As the voltage of the node N is equal to the reference voltage $V_{ref}$ the comparator 83 outputs a low level of voltage. The counter 85 is activated and counts a time until the comparator 83 outputs a low level, that is, until the capacitor charging voltage $V_{cap}$ is discharged by the bonding resistance $R_{bond}$ and reaches the reference voltage $V_{ref}$. The register 87 stores a value outputted from the counter 85.

An external controller 90 reads the counter value of the register 87 through a driving integrated circuit interface. The driving integrated circuit interface may be a CPU interface, a serial interface, an MIPI, or the like. The discharging resistance $R_x$ has a fixed value and if the bonding resistance $R_{bond}$ is increased beyond a normal value, due to the RC delay of the bonding resistance $R_{bond}$, the discharging resistance $R_x$, and the capacitor C, a discharging time is increased and the time increase is measured by the counter 85. The external controller 90 may determine whether the bonding resistance $R_{bond}$ is changed and the change amount by checking whether a counter value is changed.

Figure 10:
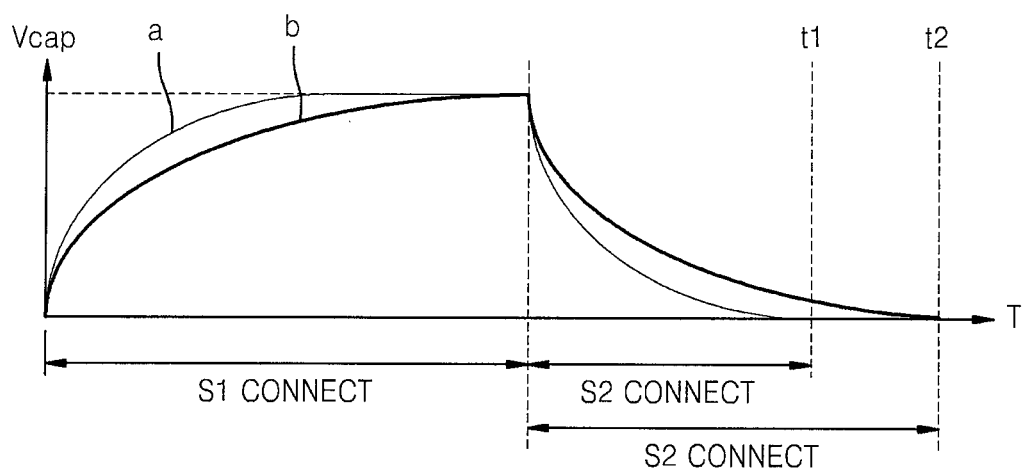
FIG. 10 is a graph illustrating the change in a capacitor voltage as a function of time, according to a measured bonding resistance according to FIG. 8.

FIG. 10 is a graph illustrating a change in capacitor voltage $V_{cap}$ as a function of time T for a measured bonding resistance $R_{bond}$, according to an example embodiment of the present invention. Referring to FIG. 10, it is observed that with respect to the capacitor C charged with the same voltage $V_{cap}$, a time t1 at which the capacitor charging voltage $V_{cap}$ is discharged when the bonding resistance $R_{bond}$ is low (curve a), is shorter than a time t2 at which the capacitor charging voltage $V_{cap}$ is discharged when the bonding resistance $R_{bond}$ is high (curve b). That is, based on the discharging time of the capacitor charging voltage $V_{cap}$, it may be determined whether or not the bonding resistance $R_{bond}$ is increased beyond a normal value, and the increased amount of the bonding resistance may be confirmed.

Once the measurement of the bonding resistance $R_{bond}$ is completed, the external controller 90 is removed.

Conventionally, a general measurement of the bonding resistance $R_{bond}$ requires at least two bonding parts (e.g., coupling parts or bonding terminals) at one test point. However, due to the lack of a mounting area, it is desirable to reduce bonding terminals. According to an embodiment of the present invention, by reducing the number of bonding parts for measuring a bonding resistance $R_{bond}$ to one, the bonding terminals may be reduced. Therefore, more driving terminals may be added or test points for measuring the bonding resistance $R_{bond}$ may be doubled in the limited bonding area (e.g., mounting area).

Additionally, when two bonding terminals are utilized, a value obtained by adding two bonding resistances $R_{bond}$ is measured during the measurement of the bonding resistance $R_{bond}$. However, according to an embodiment of the present invention, since only one bonding terminal is utilized, the bonding resistance $R_{bond}$ of only the desired bonding terminal may be measured accurately or exactly.

Moreover, according to an embodiment of the present invention, by setting the limit of a register change, a defective contact may be automatically detected in a driving integrated circuit and an operation corresponding thereto may be performed.

As described above, according to the one or more of the above embodiments of the present invention, a display device may add numerous terminals for driving to a limited bonding area or may increase a test point for measuring a bonding resistance.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A driving integrated circuit bonded to a mounting area of a display panel, the circuit comprising:
   a plurality of connection contact pads electrically coupled to a plurality of signal pads in the mounting area;
   at least one test contact pad electrically coupled to at least one test pad in the mounting area; and
   a resistance measuring unit configured to charge an external capacitor electrically coupled to a bonding part of the test pad and the test contact pad during a predetermined time and to measure a bonding resistance of the bonding part based on a charging time of the external capacitor and a magnitude of a charging voltage of the external capacitor,
   wherein the resistance measuring unit comprises:
     an amplifier selectively coupled to the external capacitor by a first switch and configured to output an output voltage to charge the external capacitor;
     a comparator having a first terminal selectively coupled to the external capacitor by a second switch and a second terminal coupled to a varying reference voltage, and configured to compare the charging voltage of the external capacitor with the varying reference voltage;
     a register configured to store an output of the comparator; and
     a reference voltage generating unit configured to increase or decrease the reference voltage and to output the reference voltage until the reference voltage is equal to the charging voltage of the external capacitor.

2. The circuit of claim 1, wherein the external capacitor is in a non-display area of the display panel.

3. The circuit of claim 1, wherein the external capacitor is at a flexible printed circuit film mounted at the display panel.

4. The circuit of claim 1, wherein the signal pad is at one end of each of a gate line and a data line at the display panel.

5. A display device comprising:
   a display panel comprising a plurality of signal pads and at least one test pad;
   a plurality of connection contact pads electrically coupled to the plurality of signal pads, and at least one test contact pad electrically coupled to the at least one test pad, in a mounting area of the display panel; and
   a resistance measuring unit configured to charge an external capacitor electrically coupled to a bonding part of the test pad and the test contact pad during a predetermined time, and to measure a bonding resistance of the bonding part based on a charging time of the external capacitor and a magnitude of a charging voltage of the external capacitor,
   wherein the resistance measuring unit comprises:
     an amplifier selectively coupled to the external capacitor by a first switch and configured to output an output voltage to charge the external capacitor;
     a comparator having a first terminal selectively coupled to the external capacitor by a second switch and a second terminal coupled to a varying reference voltage, and configured to compare the charging voltage of the external capacitor with a varying reference voltage;
     a register configured to store an output of the comparator; and
     a reference voltage generating unit configured to increase or decrease the reference voltage and to output the reference voltage until the reference voltage is equal to the charging voltage of the external capacitor.

6. The display device of claim 5, wherein the external capacitor is at a non-display area of the display panel.

7. The display device of claim 5, wherein the external capacitor is at a flexible printed circuit film mounted on the display panel.

8. The display device of claim 5, wherein the signal pad is at one end of each of a gate line and a data line at the display panel.

9. A method of measuring a bonding resistance of a display device resulting from bonding a display panel and a driving integrated circuit, the method comprising:

charging, by the driving integrated circuit during a predetermined charging time, an external capacitor outside of the driving integrated circuit and electrically coupled to a bonding part, where a test pad in a mounting area of the display panel and a test contact pad of the driving integrated circuit are electrically coupled;

measuring, by the driving integrated circuit, a magnitude of a charging voltage of the external capacitor by comparing a charging voltage of the external capacitor with a varying reference voltage until the reference voltage is equal to the charging voltage of the external capacitor; and measuring, by an external controller, a bonding resistance of the bonding part based on the charging time of the external capacitor and the magnitude of the charging voltage of the external capacitor.

10. The method of claim 9, wherein the external capacitor is in a non-display area of the display panel or on a flexible printed circuit film mounted on the display panel.

\* \* \* \* \*